United States Patent
Gray et al.

(10) Patent No.: US 7,265,010 B2
(45) Date of Patent: Sep. 4, 2007

(54) HIGH PERFORMANCE VERTICAL PNP TRANSISTOR METHOD

(75) Inventors: Peter B. Gray, Essex Junction, VT (US); Jeffrey B. Johnson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 265 days.

(21) Appl. No.: 10/863,630

(22) Filed: Jun. 8, 2004

(65) Prior Publication Data
US 2004/0248352 A1    Dec. 9, 2004

Related U.S. Application Data

(62) Division of application No. 10/065,837, filed on Nov. 25, 2002, now Pat. No. 6,909,164.

(51) Int. Cl.
*H01L 21/8238* (2006.01)

(52) U.S. Cl. ............ 438/202; 438/203; 438/969; 438/417; 438/322

(58) Field of Classification Search ........ 438/377, 438/322, 326, 969, 234, 202, 203, 417
See application file for complete search history.

(56) References Cited

U.S. PATENT DOCUMENTS

| | | | |
|---|---|---|---|
| 5,426,316 A | 6/1995 | Mohammad | |
| 5,837,590 A * | 11/1998 | Latham et al. | 438/364 |
| 6,337,252 B1 * | 1/2002 | Yoshida | 438/359 |
| 6,759,303 B1 * | 7/2004 | Cartagena | 438/322 |

* cited by examiner

*Primary Examiner*—Zandra V. Smith
*Assistant Examiner*—Seth Barnes
(74) *Attorney, Agent, or Firm*—Anthony J. Canale; Hoffman, Warnick & D'Alessandro, LLC (57) ABSTRACT

The invention includes a method and resulting structure for fabricating high performance vertical NPN and PNP transistors for use in BiCMOS devices. The resulting high performance vertical PNP transistor includes an emitter region including silicon and germanium, and has its PNP emitter sharing a single layer of silicon with the NPN transistor's base. The method adds two additional masking steps to conventional fabrication processes for CMOS and bipolar devices, thus representing minor additions to the entire process flow. The resulting structure significantly enhances PNP device performance.

8 Claims, 16 Drawing Sheets

FIG. 14

HIGH PERFORMANCE VERTICAL PNP TRANSISTOR METHOD

This application is a divisional of application Ser. No. 10/065,837, filed Nov. 25, 2002 now U.S. Pat. No. 6,909,164.

BACKGROUND OF THE INVENTION

1. Technical Field

The present invention relates to a high performance PNP transistor and method of forming vertical PNP and NPN transistors.

2. Related Art

The ever increasing use of mobile communications is driving improvements in radio frequency (RF) communications. In particular, this expanding market is demanding lower power consumption and increased performance. One possible solution that has found many applications is bipolar complementary metal-oxide semiconductor (BiCMOS) technology. See e.g., Wilson, et al., "Process HJ: A 30 GHz NPN and 20 GHz PNP Complementary Bipolar Process for High Linearity RF Circuits," BCTM, 1998, page 164; Onai, et al., "Self-Aligned Complementary Bipolar Technology for Low-Power Dissipation and Ultra-High Speed LSI's," IEEE TED, 43:3, 1995, page 413; Miwa et al., "A Complementary Bipolar Technology for Low Cost and High Performance Mixed Analog/Digital Applications," BCTM, 1996, page 185; and Chyan et al., "A 50 GHz 0.25 um . . . BiCMOS Technology for Low-Power Wireless-Communication VLSI's," BCTM, 1998, page 128.

One problem with increasing usage of this technology, however, is that only high performance vertical NPN transistors are currently available. Current low performance lateral PNP transistors are only available with a cutoff threshold (fT) of less than 1 GHz.

In view of the foregoing, there is a need in the art for a high performance PNP transistor and a method for creating NPN and PNP transistors that both exhibit high performance.

SUMMARY OF THE INVENTION

The invention includes a method and resulting structure for fabricating high performance vertical NPN and PNP transistors. The resulting high performance vertical PNP transistor includes an emitter region including silicon and germanium, and with the emitter sharing a single layer of silicon with the base of the NPN transistor. The method adds two additional masking steps to conventional fabrication processes for CMOS and bipolar devices, thus representing minor additions to the entire process flow. The resulting structure significantly enhances PNP device performance.

A first aspect of the invention is directed to a vertical PNP transistor comprising: an emitter region including silicon and germanium.

A second aspect of the invention is directed to vertical PNP and NPN transistors comprising: a single layer of silicon that forms an emitter region of the PNP transistor, an extrinsic base region of the NPN transistor and an intrinsic base region of the NPN transistor.

A third aspect of the invention is directed to a method of forming a PNP transistor while forming a CMOS device and an NPN transistor using at least two masking steps in addition to masking steps utilized in forming the CMOS and NPN devices, the method comprising: a first masking step that defines a first opening through which implants for an intrinsic base and a collector of the PNP transistor are made; and a second masking step that defines an emitter of the PNP transistor.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

The invention includes a method and resulting structure for fabricating high performance vertical NPN and PNP transistors. The method generates a high performance vertical PNP transistor as part of conventional SiGe BiCMOS fabrication technology. The resulting high performance vertical PNP transistor includes an emitter region including silicon and germanium, and has its emitter sharing a single layer of silicon with the NPN transistor's base. This structure is the result of application of a SiGe low temperature epitaxial layer that forms polysilicon over the PNP region and mono-crystalline and poly-crystalline silicon over the NPN region, followed by a single implant that forms the extrinsic base of the vertical NPN and emitter of the vertical PNP. The method adds two additional masking steps to conventional SiGe fabrication processes for CMOS and bipolar devices, thus representing minor additions to the entire process flow.

With reference to the accompanying drawings, FIGS. 1-16 illustrate fabrication process steps. Throughout the drawings, an NPN region 2 in which a vertical NPN transistor will be created is shown on the left, and a PNP region 4 in which a vertical PNP transistor will be created is shown on the right. It should be recognized that some of the steps of fabrication according to conventional SiGe technology have been omitted for brevity and clarity. Further, it should be understood that some of the conventional SiGe technology fabrication steps have been illustrated for clarity, but these steps do not necessarily form a part of the invention.

Figure 1:
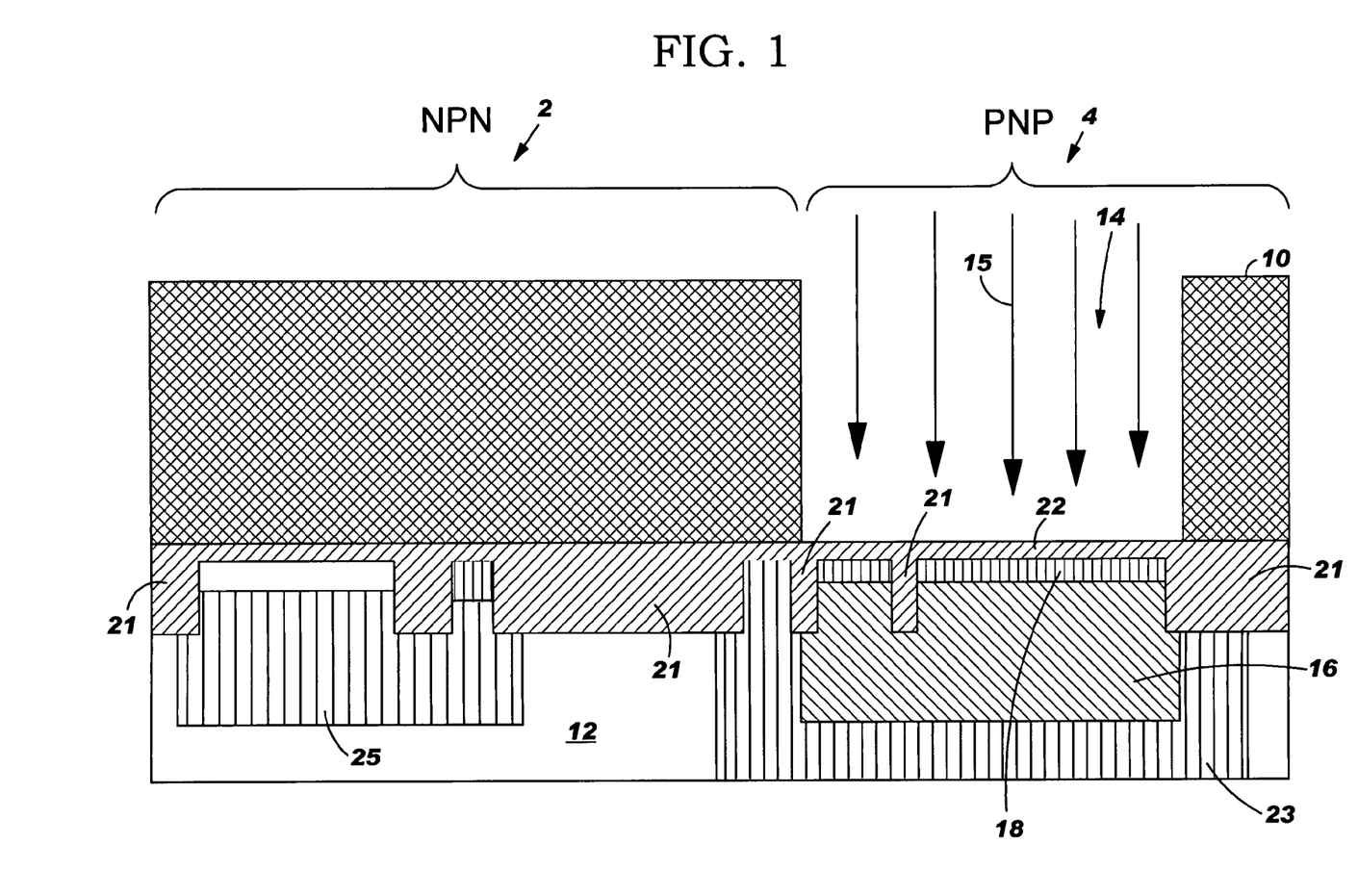
FIG. 1 show a first step of a method for fabricating a high performance PNP device.

In a first step, shown in FIG. 1, a first masking step is provided in which a photoresist 10 is applied, e.g., by spin coating, onto a silicon dioxide layer 22 (hereinafter "oxide"). Photoresist 10, and any other photoresist used herein, may be any well known or later developed photoresist material. An opening 14 is formed in photoresist 10 in a known fashion (e.g., expose and develop) for implantations 15. A first implantation may include an n-type material for creating n-type isolations 23 to p-type substrate 12 if it is desired to isolate the device from substrate 12 and/or existing processing is not provided which achieves the same purpose. Accordingly, this first implantation is optional. Second, a p-type material for creating a collector 16 of the vertical PNP transistor is provided. Finally, an n-type material for creating an intrinsic base 18 of the vertical PNP transistor. A number of other structures may also be created prior to the above-described implantations. Among these structures, as shown in FIG. 1, are shallow trench isolations (STIs) 21, oxide layer 22, and an NPN subcollector 25. The n-type material used here, and throughout this description, may be any well known or later developed material for such doping, e.g., arsenic, phosphorous, antimony, or a combination of these materials. Similarly, the p-type material used here, and throughout this description, may be any well known or later developed material for such doping, e.g., boron, indium, or a combination of these materials. Subsequently, photoresist 10 is removed in a known fashion, e.g., by etching.

Figure 2:
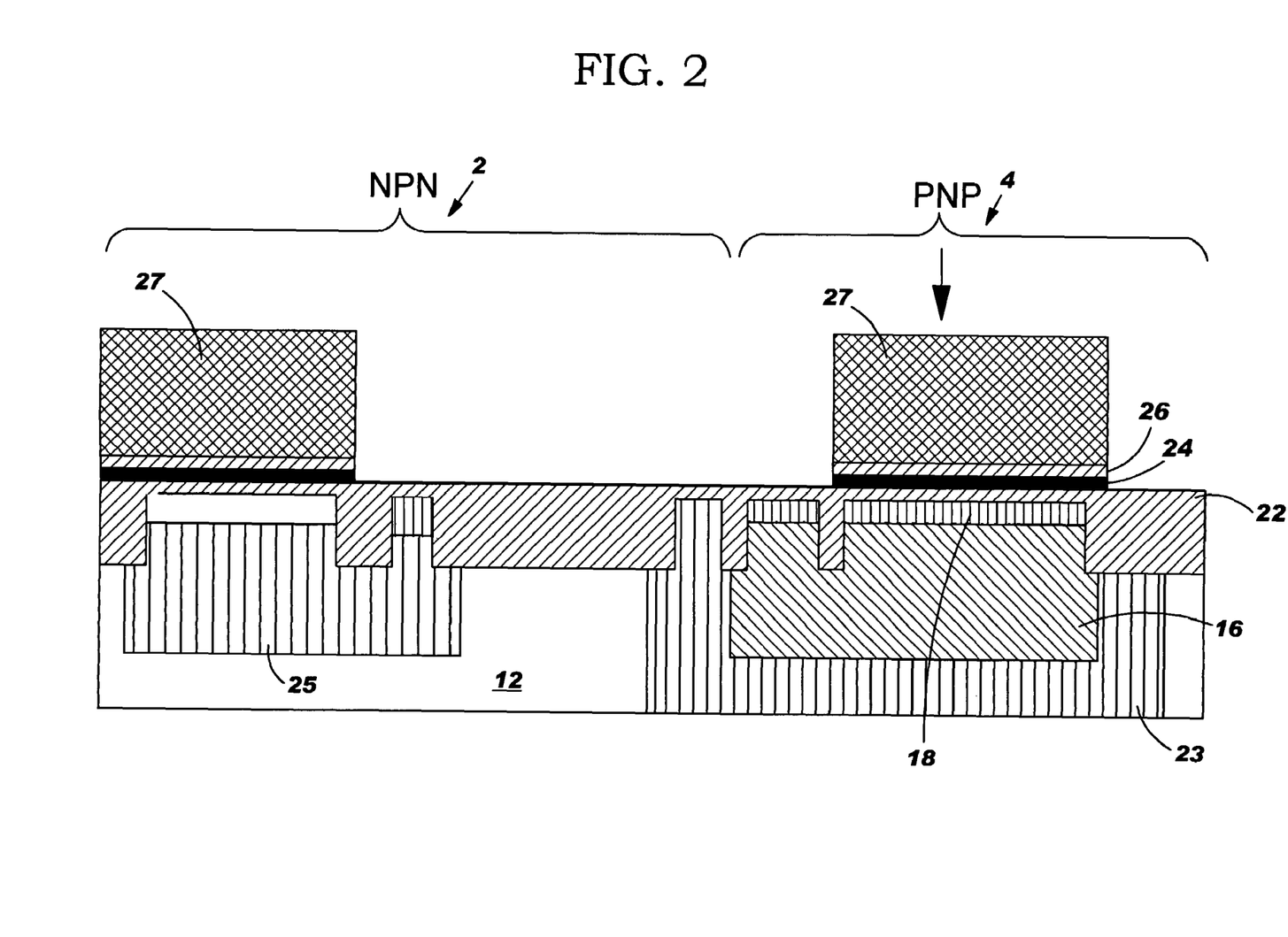
FIGS. 2 and 3 show a second and third step, respectively, of the method.

FIG. 2 shows a second step in which a layer of silicon nitride 24 (hereinafter "nitride") is deposited followed by a layer of oxide 26. Bipolar areas are masked with resist 27 and layers 24, 26 etched to reveal non-bipolar areas. The resist 27 is then removed, and layers 24, 26 protect the bipolar areas from CMOS processing. It should be recognized, however, that these steps may not be necessary depending on the CMOS processes. Note, that the figures that follow show layers 24, 26 as though they were not etched. At this point, well known fabrication steps (not shown) to partially generate CMOS devices may be carried out. The CMOS processing may, or may not, leave a blanket nitride film (not shown). CMOS processing, however, removes oxide layer 26, so another oxide layer 26 may need to be re-deposited to protect CMOS areas during bipolar processing.

Figure 3:
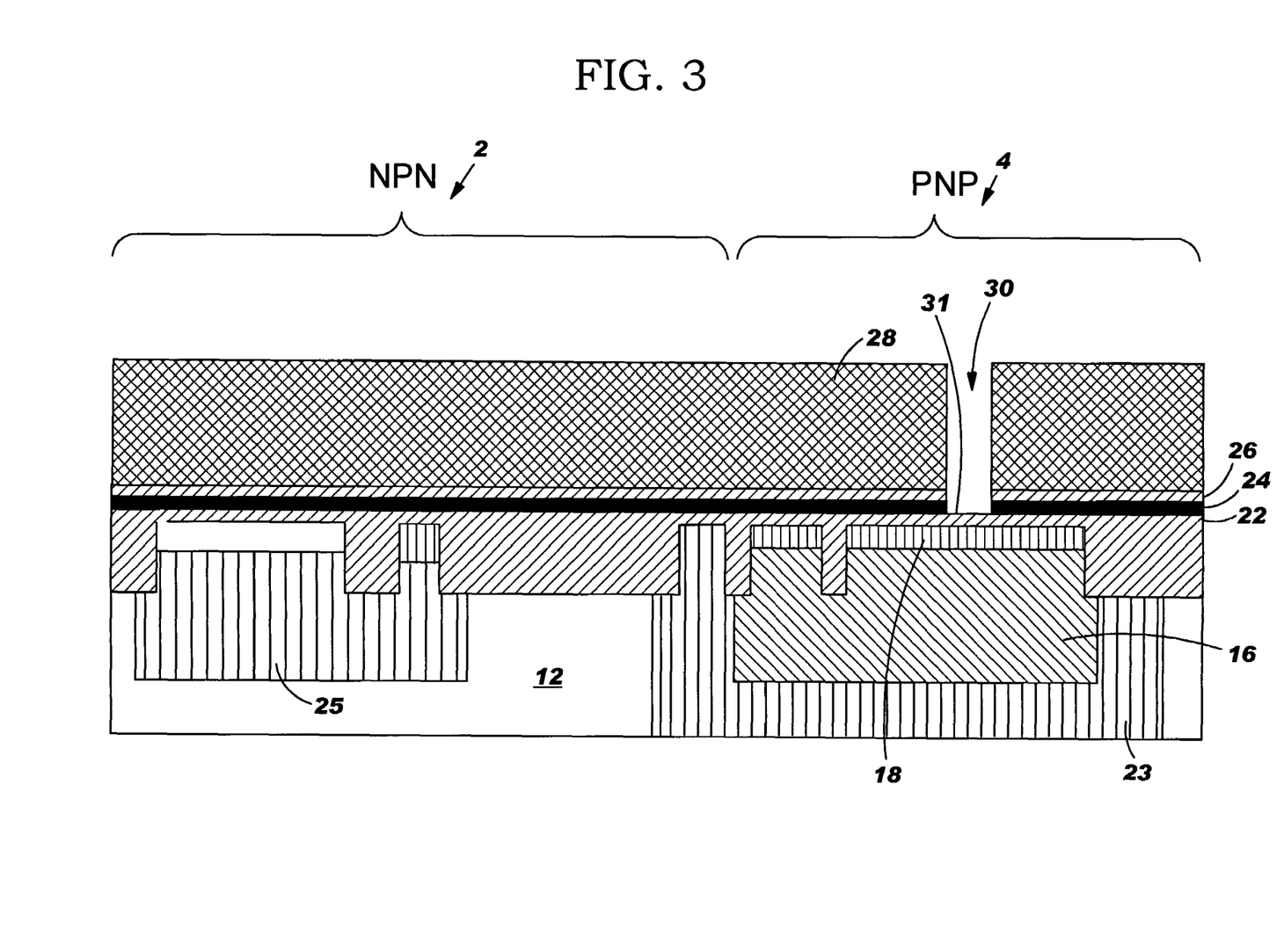

FIG. 3 shows a third step in which a second mask is formed by applying a photoresist 28 upon layers 24, 26, and creating an opening 30, e.g., by developing through photoresist 28 and etching layers 22, 24, 26, to expose a surface 31 of oxide layer 22 (substrate 12) in PNP region 4. Photoresist 28 is then removed, e.g., by etching.

Figure 4:
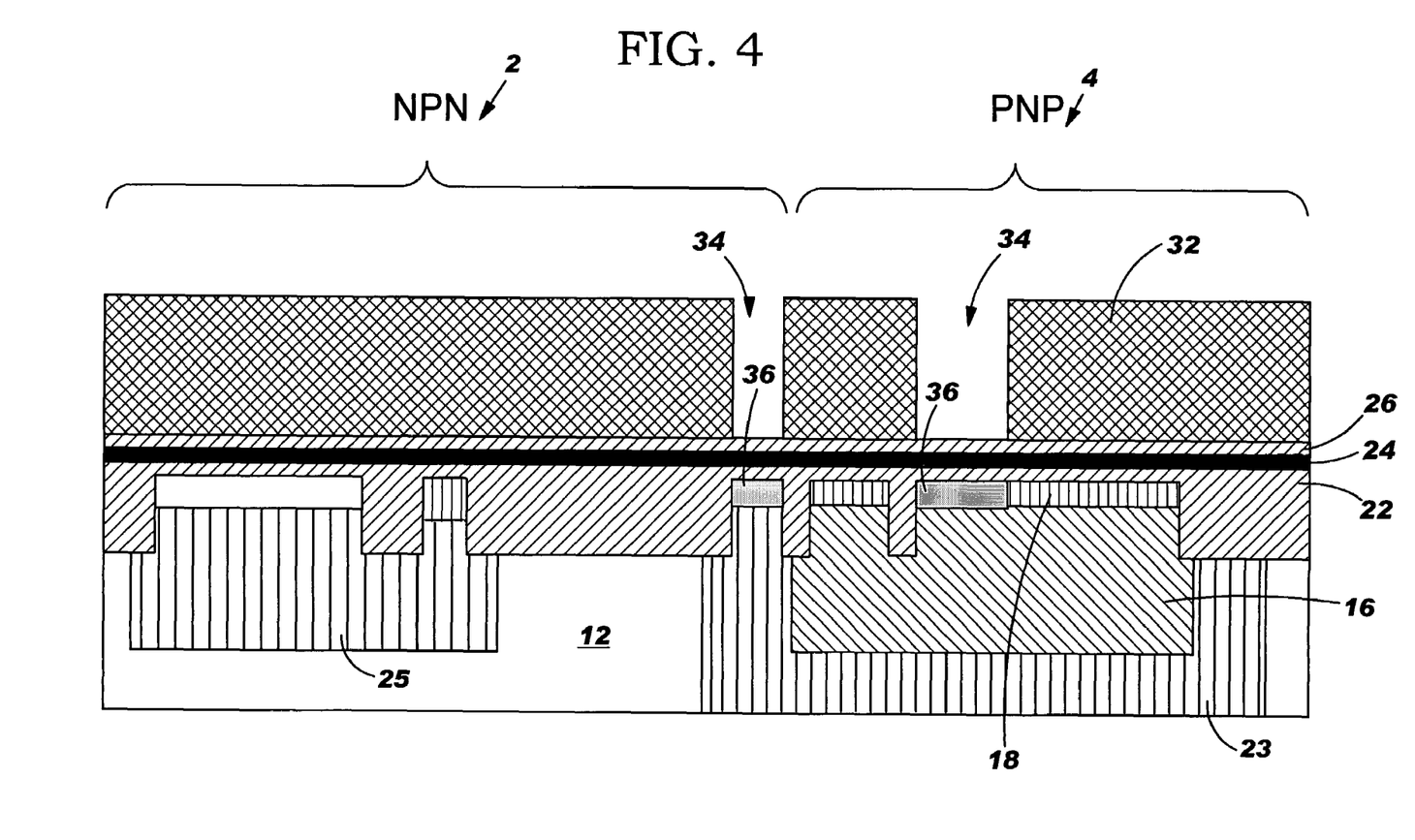
FIG. 4 shows an optional fourth step of the method.

Turning to FIG. 4, an optional fourth step is illustrated. This optional fourth masking step includes applying a photoresist 32 and developing openings 34 over locations in which an extrinsic base 36 of PNP region 4 will be generated. Next, implantation of an n-type material to form extrinsic base 36 of PNP region 4 may be carried out. Subsequently, photoresist 32 is removed. If this step is not carried out, as shown in FIG. 15, the n-type implant that forms extrinsic base 36 of PNP region 4 can be completed at the end of processing, discussed below, using the NFET source/drain implantation. This latter option saves a masking step but creates higher base resistance and thus lower PNP transistor performance. For clarity, FIGS. 5-14 do not show the extrinsic base portions 36.

Figure 5:
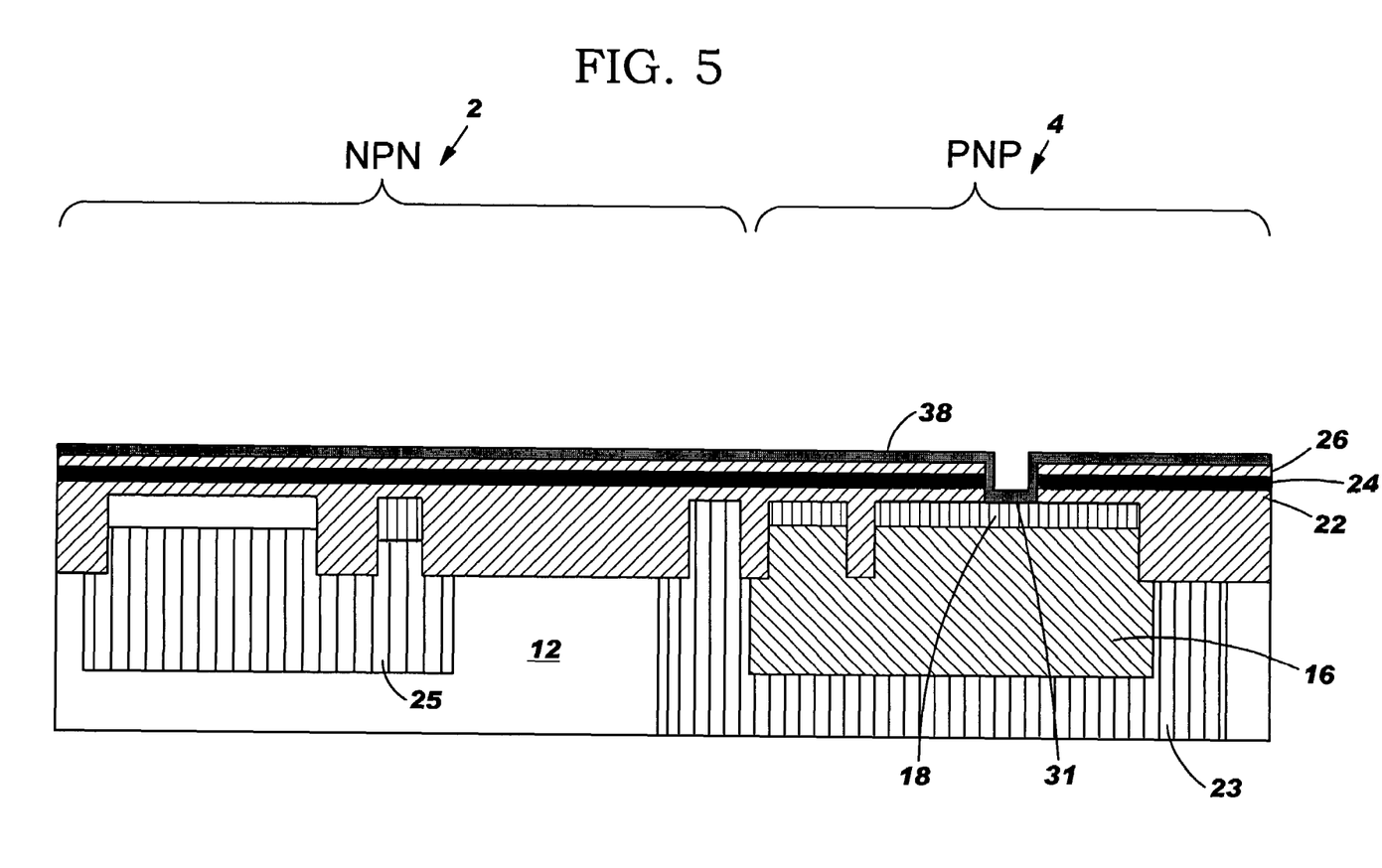
FIGS. 5-15 show respective fifth to fifteenth steps of the method.

FIG. 5 shows a fifth step in which a layer of polysilicon 38 is deposited, which fills the opening over PNP region 4 and touches surface 31. Polysilicon layer 38 may be no less than 10 nm and no more than 100 nm, and is typically approximately 45 nm.

Figure 6:
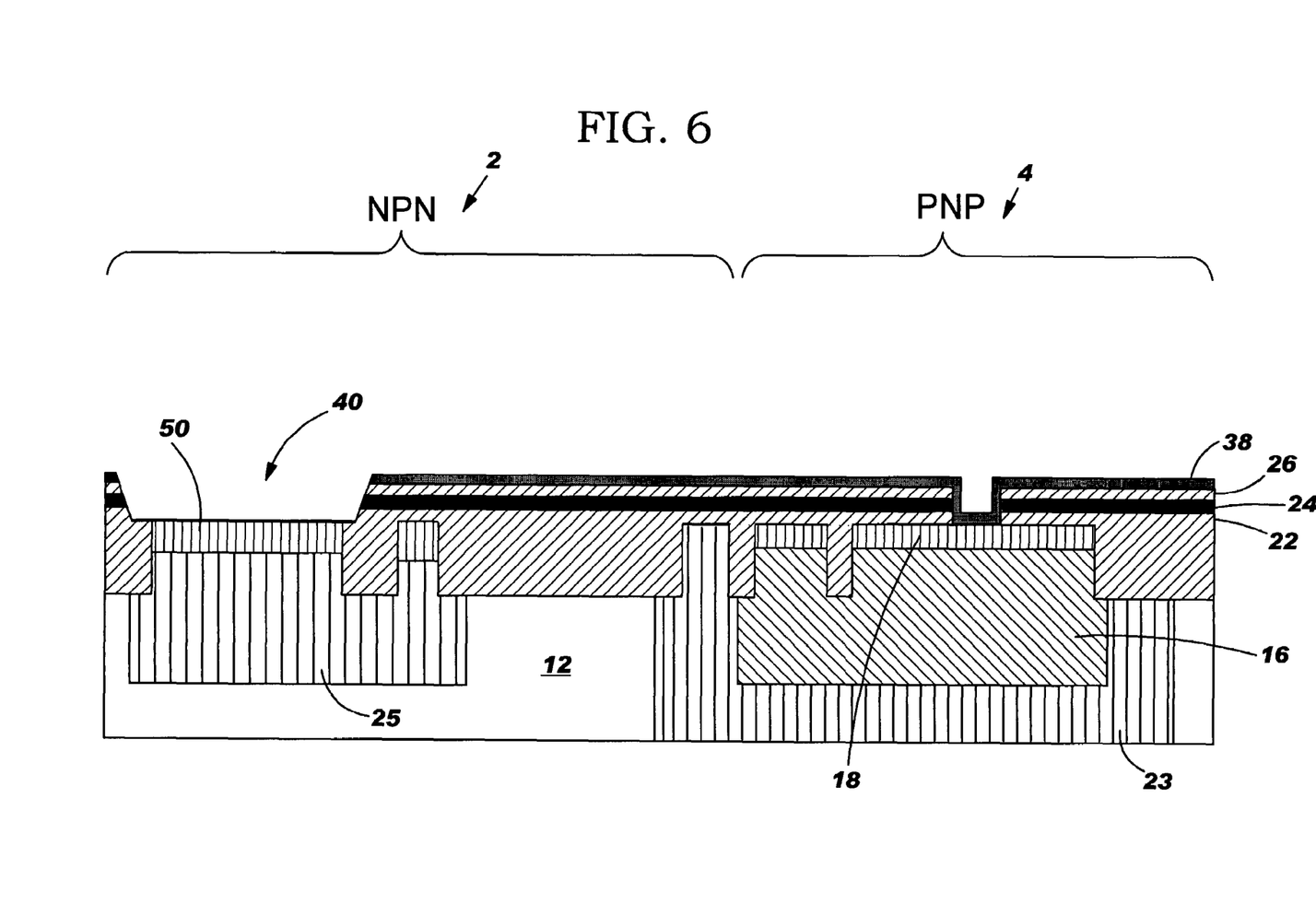

Next, as shown in FIG. 6, an opening 40 is generated over NPN region 2 by depositing an oxide (not shown) and masking by applying/developing a photoresist (not shown), and etching polysilicon layer 38 to nitride layer 24 over NPN region 2. (Note: oxide may not be necessary depending on prior processing.) At this point, an implantation of N-type material is made to form an NPN collector 50 (this implant may not be necessary depending on prior NPN collector processing). Subsequently, the resist is removed, and etching is conducted to oxide layer 22 or substrate 12 over NPN region 2 depending on subsequent processing.

Figure 7:
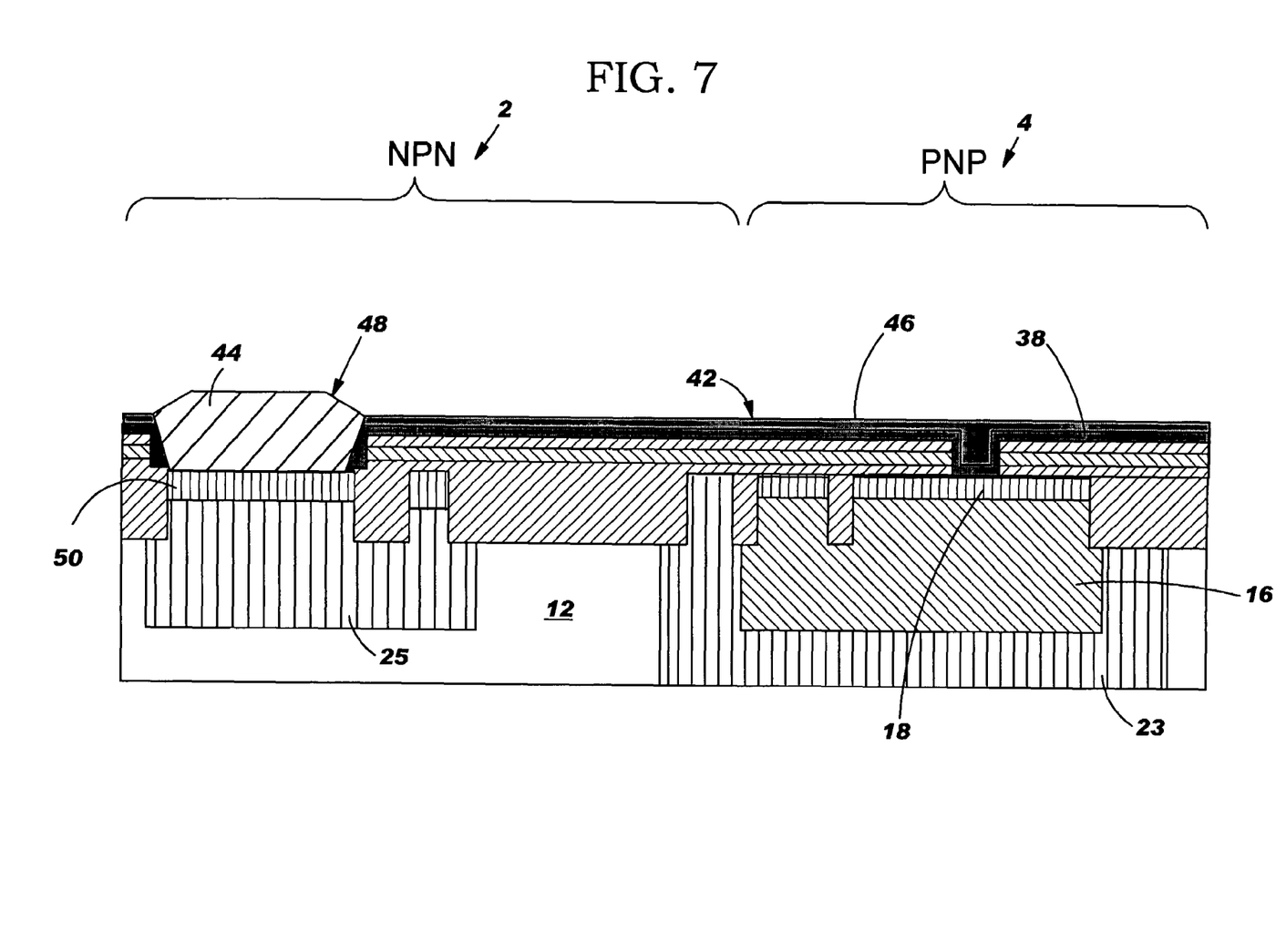

In the next step, shown in FIG. 7, an epitaxial layer 42 of silicon-germanium (SiGe) is grown over the entire wafer. As the epitaxial layer 42 grows, the SiGe grows as a monocrystal layer 44 over NPN region 2 since it is in contact with silicon, but grows a poly-crystalline layer 46 over polysilicon 38, i.e., the area over the PNP region 4. As the deposition occurs, p-type material will be added such that the resulting layer 42 includes a p-type base 48 of NPN region 2. In some cases, epitaxial layer 42 may also include some carbon deposited in proximity to the p-type material added to layer 42. The resulting layer 42 includes a region of germanium with a maximum concentration of no less than 10% and no more than 30% of the combined silicon and germanium composition.

Figure 8:
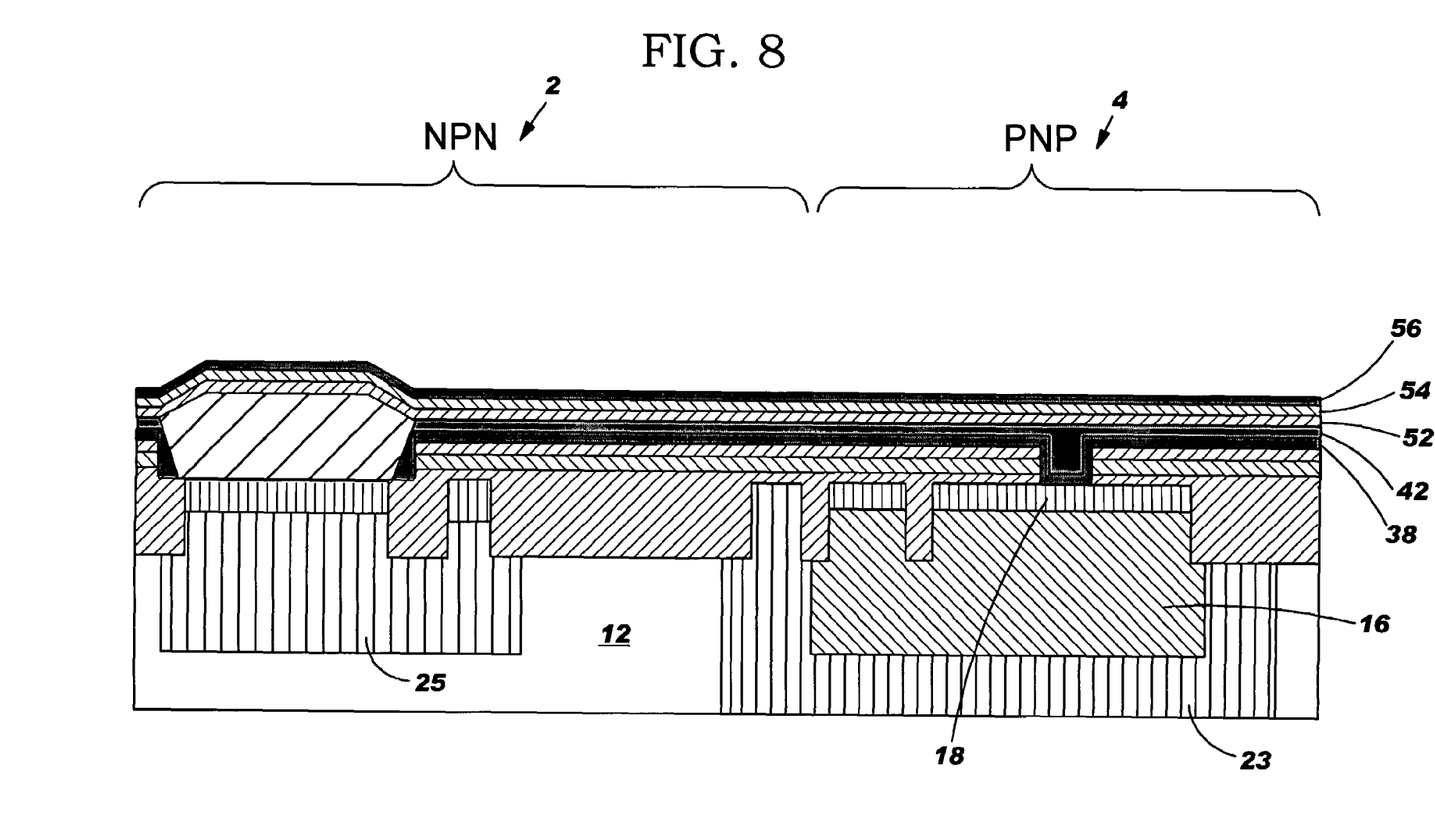

FIGS. 8-16 show continuing steps of well known SiGe technology that ultimately result in the final high performance NPN and PNP transistors. These steps are outlined in U.S. Pat. No. 5,111,271, hereby incorporated by reference. It should be recognized that these steps may vary somewhat as the integration scheme is adapted to different applications. FIG. 8 shows a step in which an oxide layer 52 is grown over the entire wafer, followed by deposition of a nitride layer 54 and finally a polysilicon layer 56.

Figure 9:
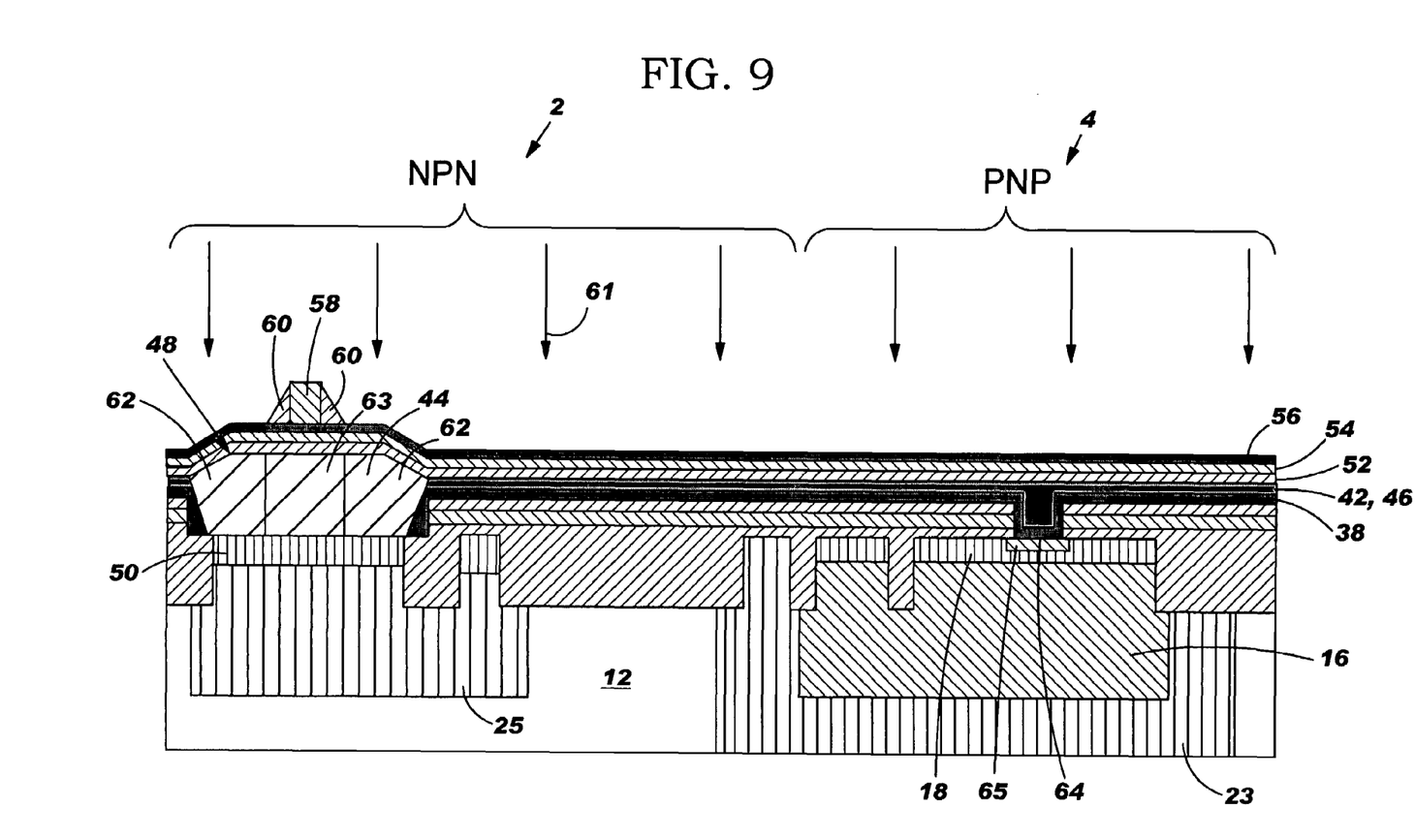

FIG. 9 shows a next step in which another layer of nitride (not shown) is deposited and then etched away to form a mandrel 58 over NPN region 2. In addition, oxide spacers 60 are formed in a conventional fashion (e.g., deposit oxide and etch) adjacent to mandrel 58. Next, a p-type material 61 (e.g., boron) is implanted to form an extrinsic base 62 of NPN region 2 and an emitter 64 of PNP region 2. The p-type material diffuses slowly in mono-crystal layer 44, but diffuses rapidly in the poly-crystalline layers, i.e., polysilicon layer 38 and SiGe layer 46. A p-type out-diffusion 65 is formed by the rapid diffusion in polysilicon. As a result, an emitter 64 of PNP region 4 is simultaneously formed with extrinsic base 62 of NPN region 2. The resulting structure includes polysilicon in emitter region 64 of the PNP transistor and mono-crystal silicon in a portion of the extrinsic base region 62 and mono-crystal silicon in the intrinsic base region 63 of the NPN transistor.

Figure 10:
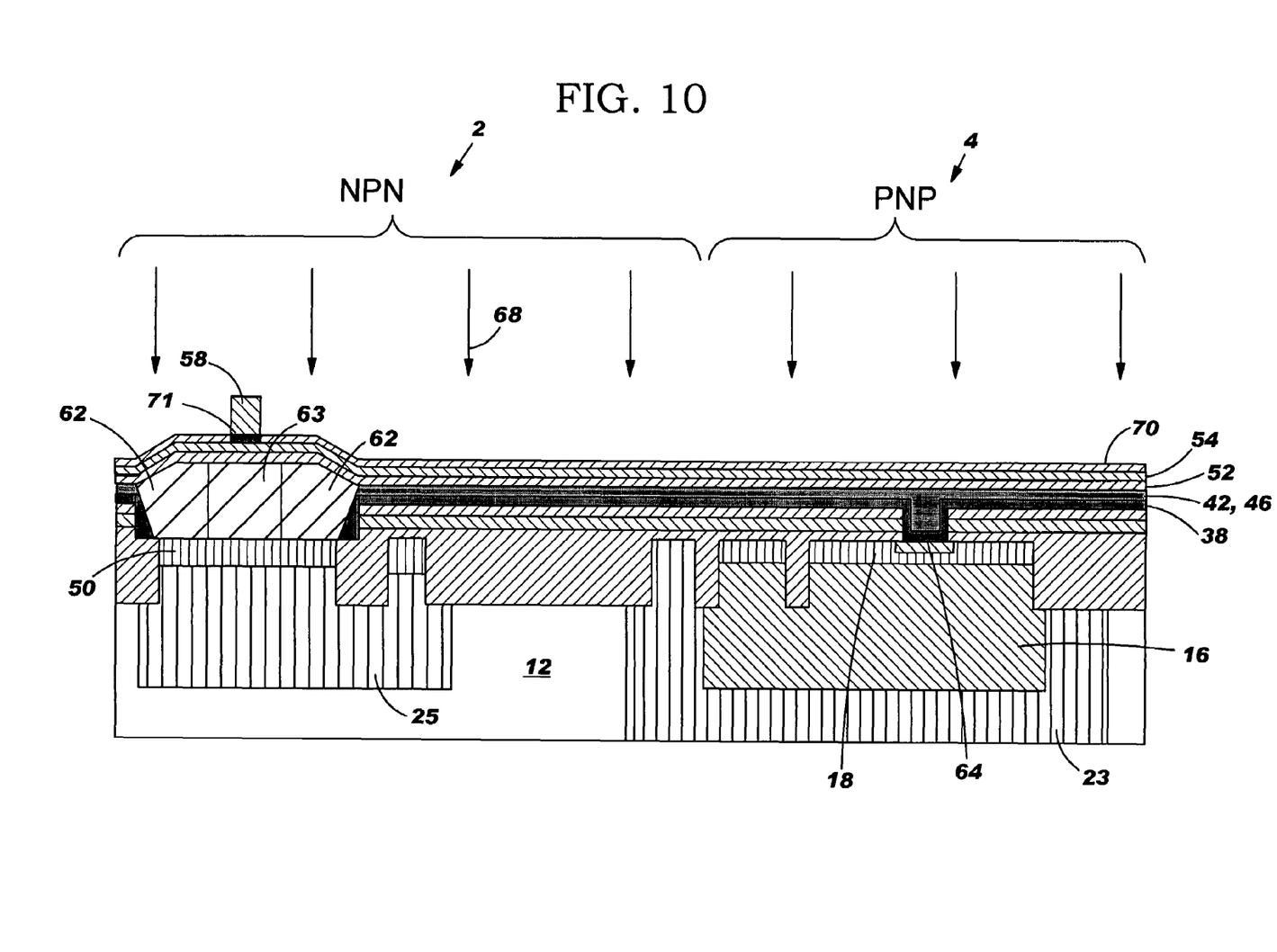

As shown in FIG. 10, the next step involves etching away spacers 60 (FIG. 9) from mandrel 58 and conducting a heavy oxidation 68. As the oxidation occurs, polysilicon layer 56 (FIG. 9) turns to oxide layer 70. However, a portion 71 of polysilicon layer 56 under nitride mandrel 58 remains polysilicon, hence, transferring mandrel 58 shape to the polysilicon layer 56. The resulting structure allows the yet-to-be formed emitter of NPN region 2 to self-align with extrinsic base 62 of NPN region 2.

Figure 11:
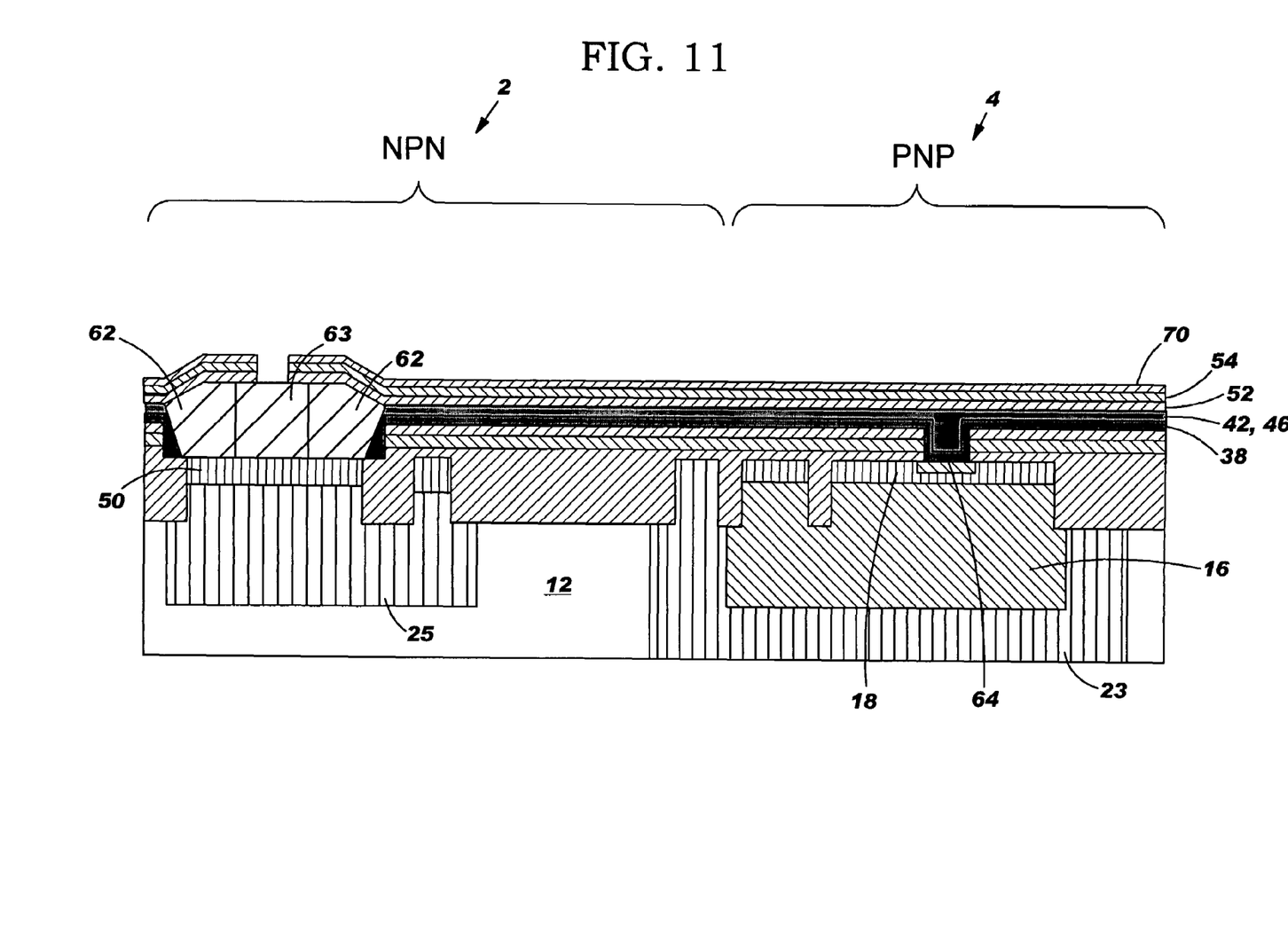

Referring to FIG. 11, the next step includes selectively etching away polysilicon portion 71, nitride mandrel 58 and the portion of oxide layer 70, nitride layer 54 and oxide layer 52 thereunder.

Figure 12:
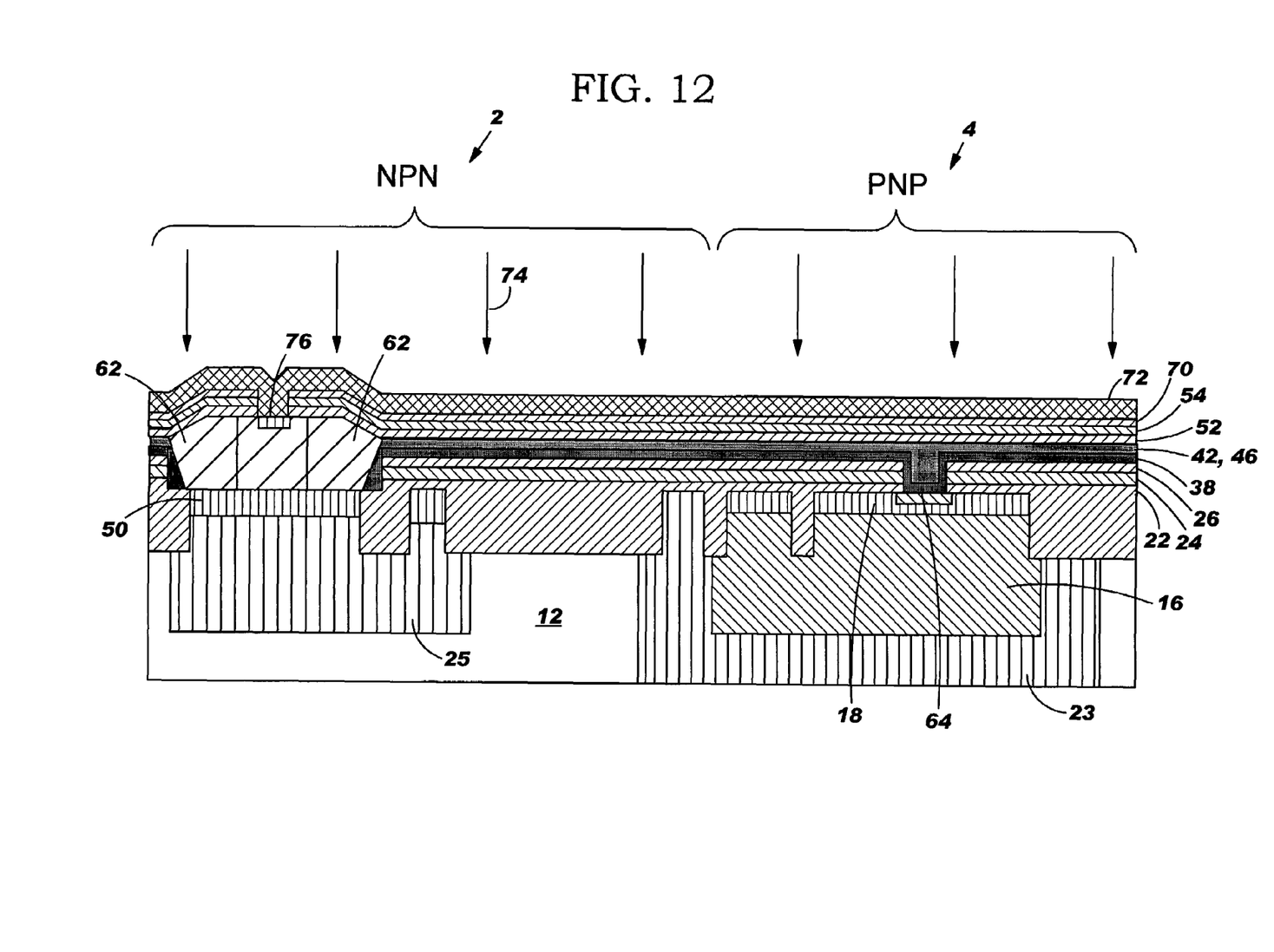

The next step, shown in FIG. 12, includes depositing a polysilicon layer 72 and doping it either during deposition or by implant 74 with an n-type material to form an emitter 76 of NPN region 2.

Figure 13:
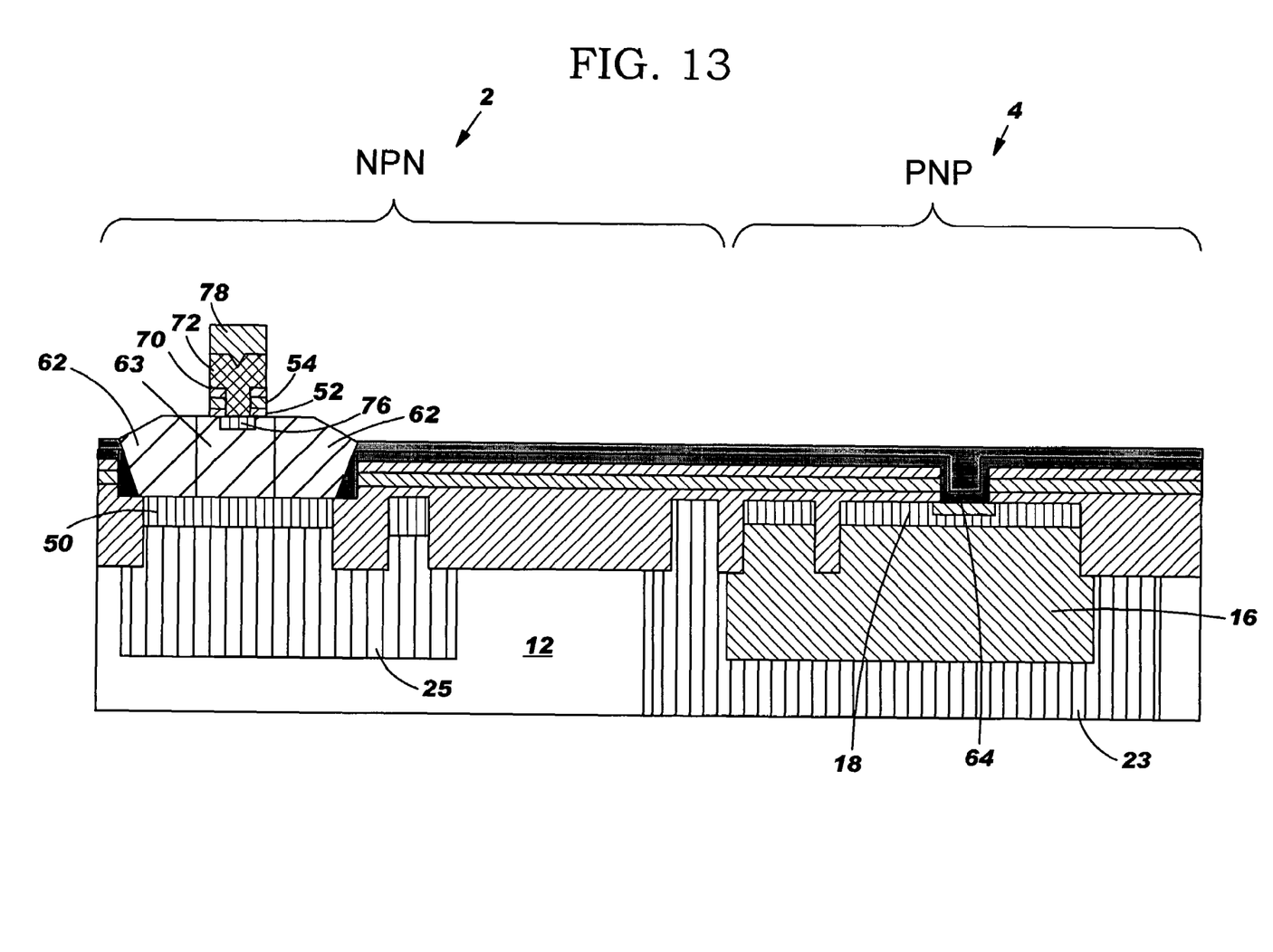

As shown in FIG. 13, a nitride layer 78 is deposited. NPN emitter 76 is then masked off with photoresist (not shown). Next, the various layers, i.e., nitride layer 78, polysilicon layer 72, oxide layers 52, 70 and nitride layer 54, are otherwise removed, e.g., by etching. Subsequently, the resist (not shown) is removed.

Figure 14:
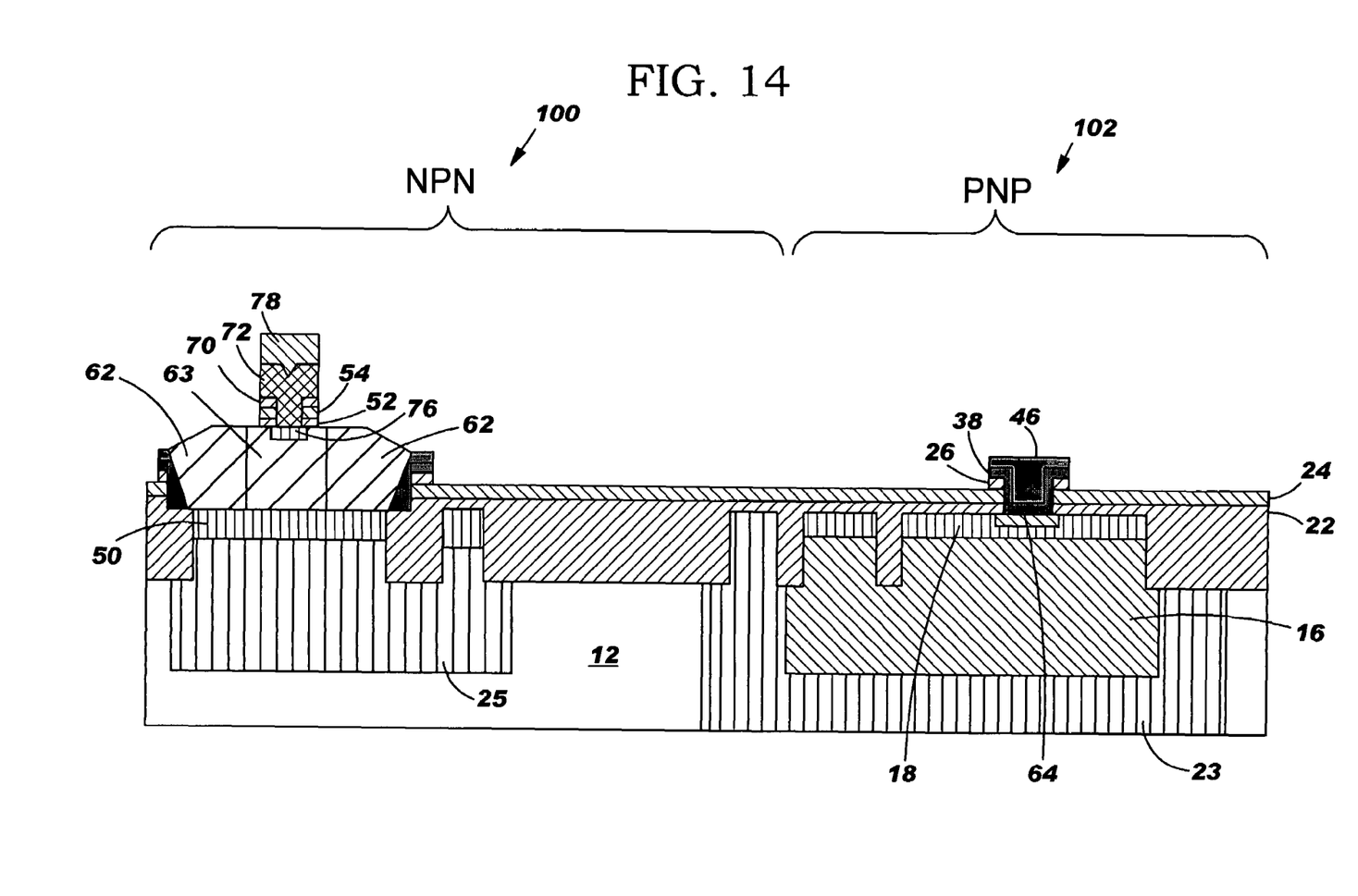
Figure 15:
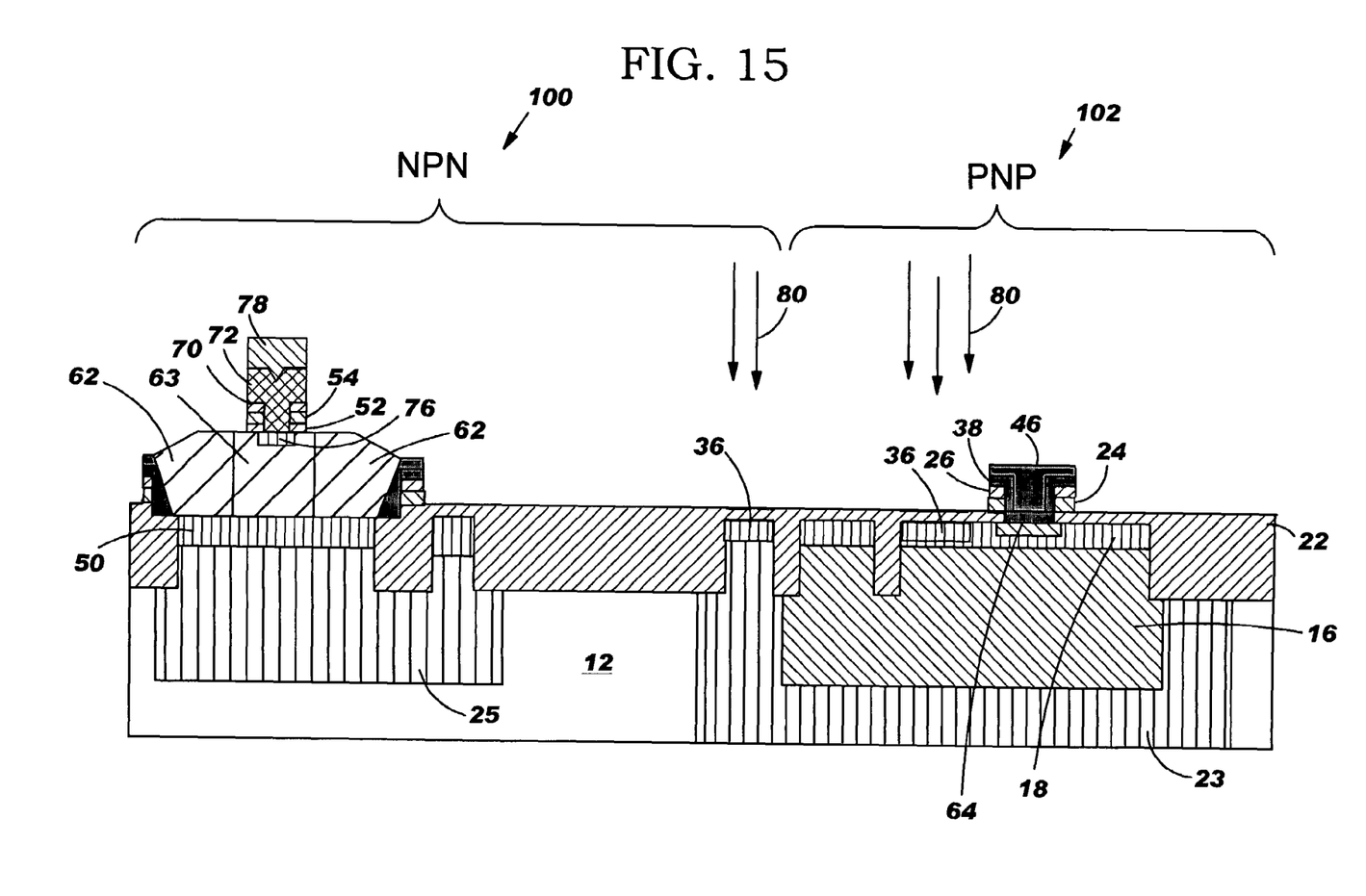

The next step, shown in FIG. 14 includes masking NPN region 2 and PNP emitter 64 with photoresist (not shown), and etching the SiGe polysilicon layer 46 and polysilicon layer 38 away. This etch defines the base of NPN transistor 100 and emitter 64 of PNP transistor 102. The photoresist (not shown) is then stripped and oxide layer 26 is etched.

Referring to FIG. 15, if the optional third mask, shown in FIG. 4, was omitted, the CMOS NFET source/drain processing (not shown) could be used to form extrinsic base 36 of PNP region 4. In this situation, nitride layer 24 (if present) would be etched, a photoresist mask formed and an N-type material 80 implanted to create extrinsic base 36. The photoresist (not shown) would then be stripped.

Figure 16:
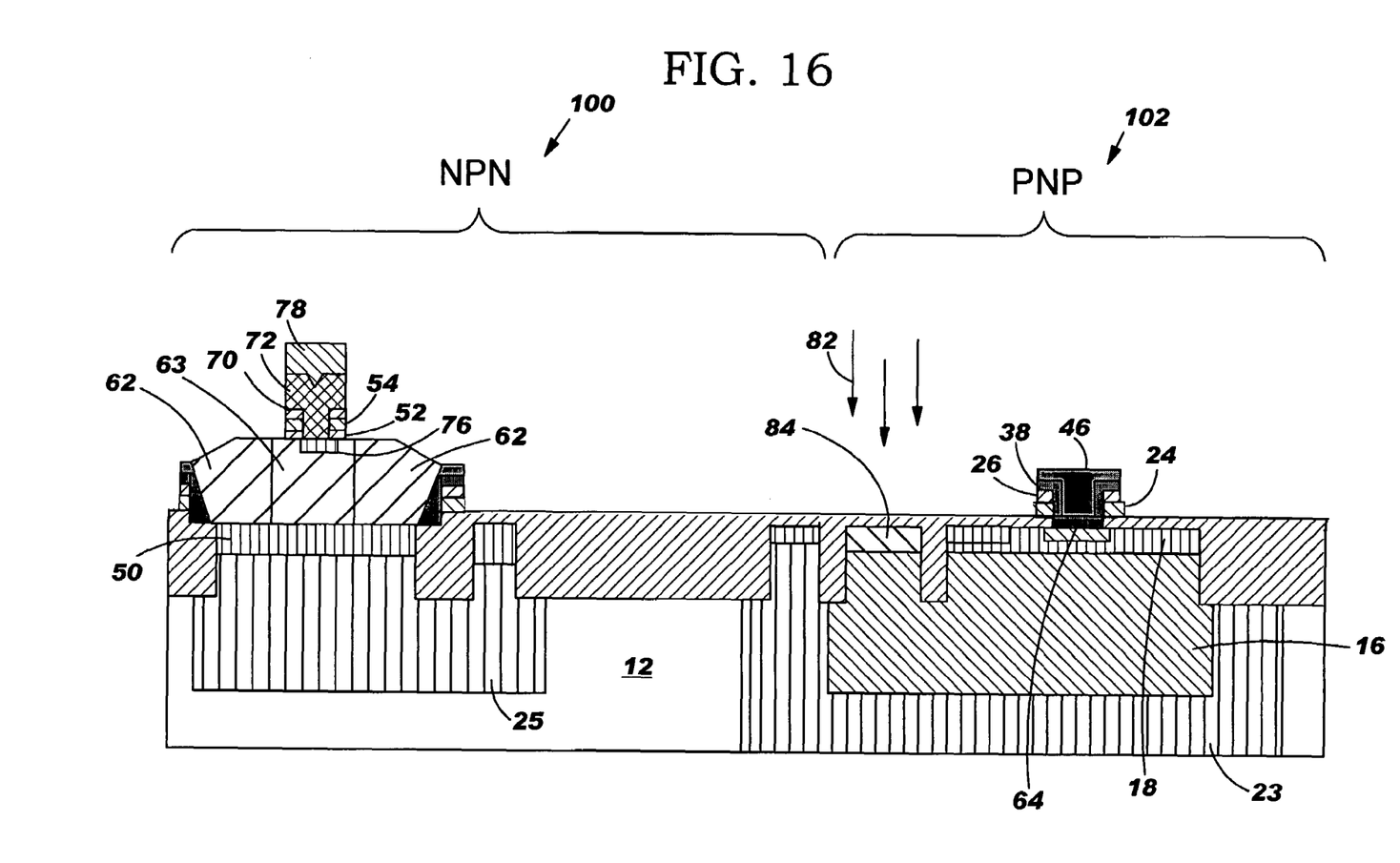
FIG. 16 shows a sixteenth step of the method and the resulting high performance NPN and PNP transistors.

Finally, as shown in FIG. 16, a p-type material 82 implant for forming a PFET source/drain (not shown) is made through a mask (not shown). This implant also forms a PNP collector contact 84.

With continuing reference to FIG. 16, the resulting vertical transistors 100, 102 include a polysilicon emitter 64 for PNP transistor 102 and a polysilicon emitter 76 for NPN transistor 100. Vertical PNP transistor 102 includes an emitter region 64 including silicon and germanium. In addition, vertical NPN and PNP transistors 100, 102 include a single layer of silicon that forms emitter region 64 of PNP transistor 102, an extrinsic base 62 of NPN transistor 100, and an intrinsic base 63 of NPN transistor 100. The resulting structure provides a PNP transistor 102 with significantly enhanced performance (perhaps having a cutoff frequency fT>1 GHz) compared to current lateral PNP transistors.

The method of forming PNP transistor 102, as described above, uses two additional masking steps, FIG. 1 and FIG. 3, in addition to masking steps utilized in forming the CMOS devices (not shown) and NPN transistor 102. CMOS process steps not shown may include gate oxide growth, FET polysilicon deposition and etch, spacer growths and/or depositions and etches, extension and halo masks and implants, source/drain masks and implants, etc. The first masking step of FIG. 1 defines an opening 14 through which both PNP intrinsic base 18, PNP collector 16 and PNP n-type isolation 23 (latter, optional if prior mask and implant could be used for same function) implants are made. The second masking step of FIG. 3 defines an opening 30 through which PNP emitter 64 is formed.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a PNP transistor while forming a CMOS device and an NPN transistor using at least two masking steps in addition to masking steps utilized in forming the CMOS and NPN devices, the method comprising:

a first masking step that defines a first opening through which implants for an intrinsic base and a collector of the PNP transistor are made;

a second masking step that defines a second opening for generating an emitter of the PNP transistor;

depositing a layer of polysilicon over the second opening; and growing an epitaxial layer of silicon and germanium, wherein the silicon grows as a polysilicon over the polysilicon layer and as a mono-crystal silicon over the NPN.

2. The method of claim 1, further comprising the step of implanting an n-type isolation through the first opening to separate the PNP collector from a substrate.

3. The method of claim 1, further comprising a third masking step that defines at least one opening through which an implant for an extrinsic base of the PNP is made.

4. The method of claim 1, further comprising the step of simultaneously forming the emitter of the PNP and an extrinsic base of the NPN by implanting p-type material.

5. The method of claim 4, wherein the emitter of the PNP includes silicon and germanium.

6. The method of claim 1, wherein the epitaxial layer also includes carbon.

7. The method of claim 1, further comprising the step of adding p-type material during the growing step.

8. The method of claim 1, wherein the polysilicon layer is no less than 10 nm, and wherein the polysilicon layer is no more than 100 nm.

* * * * *